United States Patent [19]

Satou et al.

[11] Patent Number: 4,874,444

[45] Date of Patent: Oct. 17, 1989

[54] DIE-BONDING METHOD AND APPARATUS THEREFOR

[75] Inventors: Takeo Satou; Yasuhiko Shimizu, both of Yokohama, Japan

[73] Assignee: Kabushiki Kaisha Toshiba, Kawasaki, Japan

[21] Appl. No.: 145,320

[22] Filed: Jan. 19, 1988

[30] Foreign Application Priority Data

Jan. 19, 1987 [JP] Japan .................................. 62-9578

[51] Int. Cl.$^4$ ............................................. B65D 83/14
[52] U.S. Cl. ..................................... 156/64; 118/679; 118/682; 156/356; 222/61; 222/399; 222/639; 222/642
[58] Field of Search ................... 222/61, 399, 639, 642; 141/83; 118/682, 684, 679; 156/356, 357, 64

[56] References Cited

U.S. PATENT DOCUMENTS

| | | | |
|---|---|---|---|
| 3,347,418 | 10/1967 | Fefferman | 222/61 |
| 3,499,580 | 3/1970 | Smith | 222/61 X |
| 3,666,143 | 5/1972 | Weston | 222/61 |
| 4,164,001 | 8/1979 | Patnaude | 118/684 X |
| 4,334,636 | 6/1982 | Paul | 222/642 |
| 4,675,301 | 6/1989 | Charneski et al. | 222/61 X |

OTHER PUBLICATIONS (Relevant Catalogue), "Automatic System Dispenser" catalogue, Iwashita Engineering, Inc., 1986/2.
(Relevant Catalogue), Toray "Pro-Hi-Dispenser Pad-1000 Series" catalogue, Toray Engineering Kabushiki Kaisha (No publication date).
(Relevant Document), "Automated Technology", vol. 12, No. 7, Jul. '86, Title "Guide to Practical Technology", (pp. 94–96) Taiji Sugihara, Kato Giko Ltd.

*Primary Examiner*—David Simmons
*Attorney, Agent, or Firm*—Foley & Lardner, Schwartz, Jeffery, Schwaab, Mack, Blumenthal & Evans

[57] ABSTRACT

This die-bonding method relates to an improvement in a method to apply high pressure air to a resin vessel under a predetermined discharge condition to discharge the resin onto a portion subject to bonding, thus to adhesively join or connect a semiconductor chip to the portion subject to bonding by the resin discharged. This method includes a process for detecting a pressure waveform applied to the resin vessel, and a process for controlling the discharge condition to compensate the difference between the pressure waveform detected and a predetermined reference pressure waveform so that a predetermined resin quantity is discharged at all times even when the quantity of resin within the resin vessel varies. There is also provided an apparatus for implementing this die-bonding method, which includes a correction circuit for performing the above compensating operation.

24 Claims, 4 Drawing Sheets

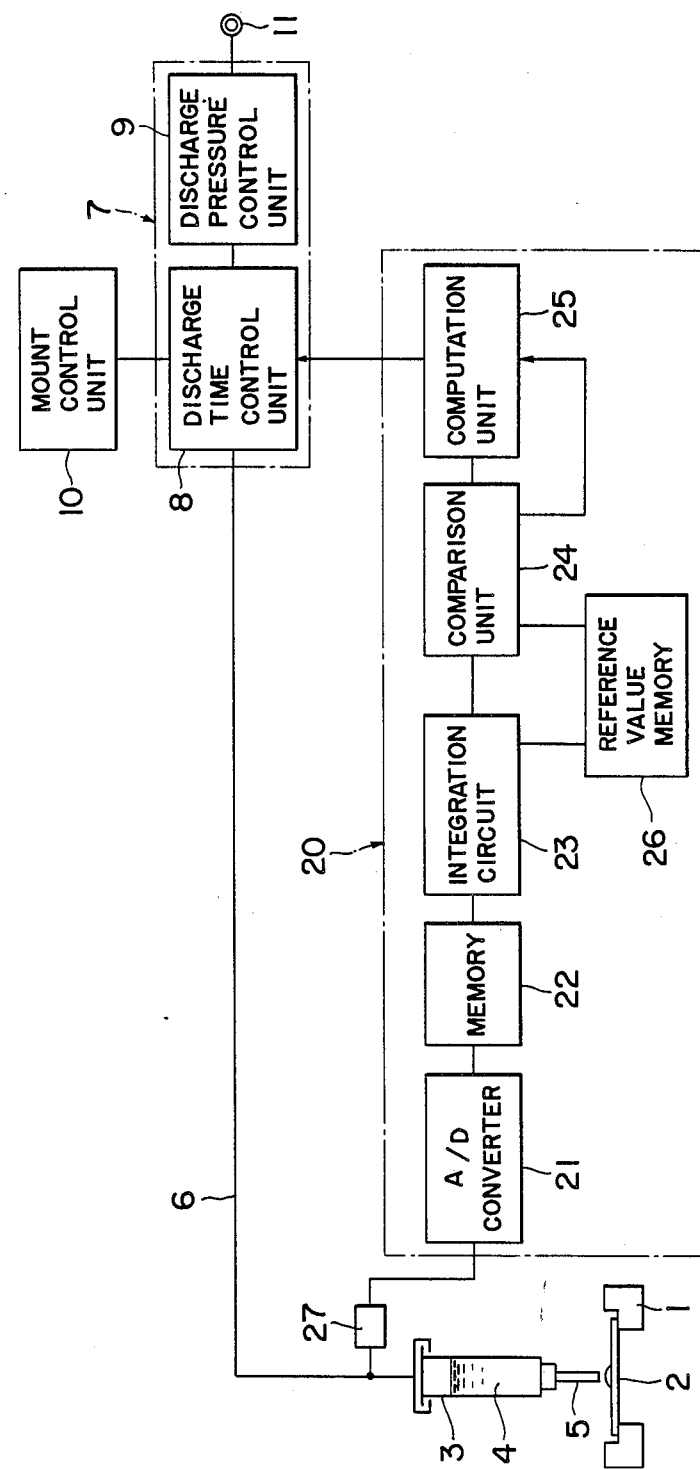
F I G. 4

(a)

(b)

(c)

(d)

DIE-BONDING METHOD AND APPARATUS THEREFOR

BACKGROUND OF THE INVENTION

This invention relates to a die-bonding method and an apparatus therefor for adhesively joining or connecting a semiconductor chip onto a portion subject to bonding such as a bed portion of a lead frame by using resin.

The implementation of typical die-bonding is shown in cross section in FIG. 1. As shown, a semiconductor chip 43 is adhesively joined or connected onto a bed portion 41 of the lead frame by a resin 42 such as thermosetting resin, thus to carry out die-bonding. In such a die-bonding, because a quantity of the resin 42 directly affects the bonding or adhesive area and the bonding strength, supply of constant quantity of the resin is important. For this reason, the screen printing method, the stamping method, the dispensing method, the air pressure constant quantity discharge method, and other methods is selected dependent upon the kind of semiconductor chip, the characteristic of the resin used, etc. Among them, the air pressure constant quantity discharge method is the method to discharge resin by air pressure. Since this method is excellent in view of the workability and effective use of resin, as compared to other methods, it has been widely used in the art.

FIG. 2 is a block diagram showing a conventional die-bonding apparatus based on the air pressure constant quantity discharge method. A needle 46 is attached at the lower portion of a resin vessel 45 filled with a thermosetting resin 44. The needle 46 faces above a bed portion 41 of a lead frame supported by a base table 47. When high pressure air is delivered into the resin vessel 45, the resin 44 within the vessel 45 drops off by a constant quantity thereof from the needle 46 onto the bed portion 41. The supply of the high pressure air is provided by a pressure unit 50 connected to the resin vessel 45 via a flow path 48. The pressure unit 50 is composed of a discharge time control unit 51 and a discharge pressure control unit 52. The discharge time control unit 51 serves to adjust the supply time of high pressure air. Actually, this unit 51 controls the drive time of an electromagnetic valve etc. for supply of high pressure air. On the other hand, the discharge pressure control unit 52 serves to adjust supply pressure of the high pressure air, which is connected to a high pressure air supply source 54. The pressure unit 50 thus applies high pressure air to the resin vessel 45 as an air pulse of predetermined discharge time and discharge pressure at a discharge timing from a mount control unit 53, thus, to thrust the resin 44 within the resin vessel 45 from the needle 46.

However, such a conventional die-bonding apparatus has the problem that the discharged quantity of the resin varies with time. This results from changes or variations in the quantity of the resin remaining within the resin vessel, 45 or changes or variations in response to the electromagnetic valve of the discharge time control unit 51. The inventor of this patent application has found that the cause of changes in the resin discharge quantity is that, the resin vessel 45 empties, varies by the discharge of the rising pressure applied to the resin vessel 45 changes. FIG. 3 is a characteristic curve showing measured changes in the discharge quantity when constant viscosity silicon resin is filled within the resin vessel 45 having an internal capacity of 5 cc, allowing resin to be intermittently discharged at a constant pressure. The resin height H (mm) and the resin discharge quantity W (g) correlate to each other when the discharge start time (START) is assumed as "0" and the discharge quantity at the time of end (END) is reduced by 15 to 25%. Namely, since the discharge quantity of the resin correlates with the pressure rising characteristic, the resin discharge quantity varies with lapse of time. This is the reason that a constant quantity or supply is impossible. Such an unfavorable phenomenon has become conspicuous more and more as a wide variety of resins in which viscosity, volatility, or the like, are different, have appeared, multiple point discharge nozzles have been implemented, and resin vessels have become large. This is a problem in respect of quantity resulting from the fact that the semiconductor chips are diversified and have become large-sized.

SUMMARY OF THE INVENTION

This invention has been made in view of the above and its object is to provide a die-bonding method and an apparatus therefor to automatically correct changes in resin discharge quantity, thereby making it possible to maintain the resin discharge quantity constant at all times.

The above-mentioned object is accomplished by a die-bonding method to apply high pressure air to a resin vessel under a predetermined discharge condition to discharge resin onto a portion subject to bonding, thus to adhesively join or correct a semiconductor chip onto the portion subject to bonding by the resin discharged, the method including a process of detecting a pressure waveform applied to the resin vessel, and a process of controlling the discharge condition to compensate a difference between the pressure waveform detected and a predetermined reference pressure waveform so that a predetermined resin quantity is discharged at all times even when the quantity of resin within the resin vessel varies.

In addition, the above-mentioned object is accomplished by a die-bonding apparatus comprising a resin vessel filled with resin for adhesively joining or connecting a semiconductor chip onto a portion subject to bonding, a pressure unit for supplying high pressure air to the resin vessel at predetermined discharge time and discharge pressure, a pressure sensor for detecting a pressure waveform applied to the resin vessel, and a correction circuit for comparing the pressure waveform detected by the pressure sensor with a predetermined reference pressure waveform to control the discharge condition of the pressure unit so as to compensate the difference therebetween.

BRIEF DESCRIPTION OF THE DRAWINGS

FIG. 4 is a block diagram showing a die-bonding apparatus according to an embodiment of this invention;

DETAILED DESCRIPTION OF THE INVENTION

Figure 1:
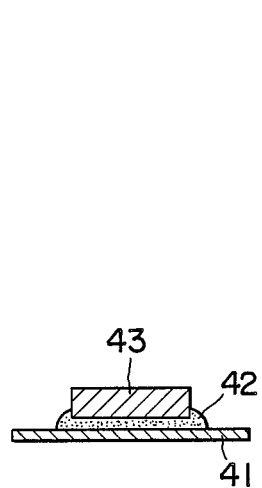
FIG. 1 is a cross sectional view showing how the typical die-bonding is implemented.
Figure 3:
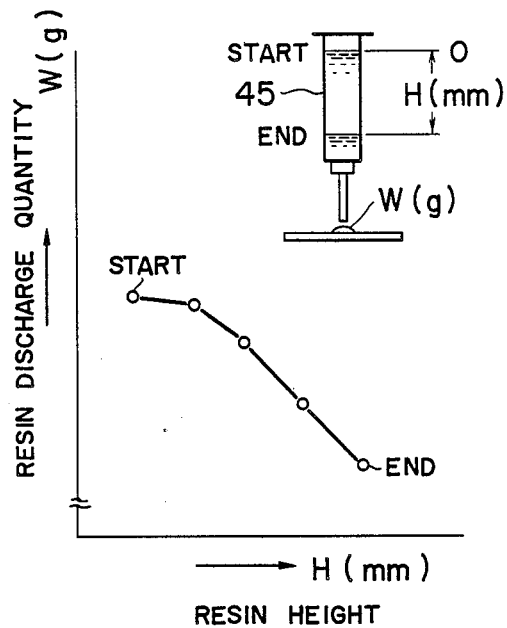
FIG. 3 is a characteristic diagram showing the relationship between resin residual quantity and resin discharge quantity.
Figure 2:
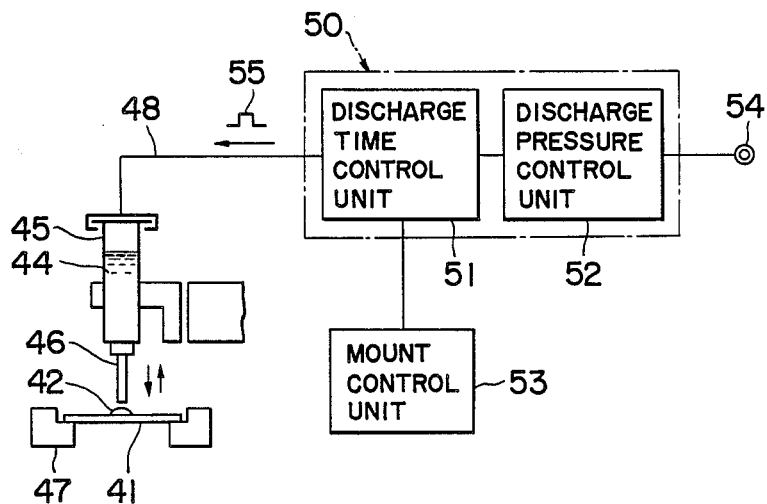
FIG. 2 is a block diagram showing a conventional die-bonding apparatus.

This invention will be described in more detail with reference to the attached drawings.

FIG. 4 shows a die-bonding apparatus according to an embodiment of this invention. Above a portion subject to bonding of a lead frame 2 mounted on a base table 1, a resin vessel 3 is provided. The resin vessel 3 is filled therein with a resin 4 such as a thermosetting resin for bonding or adhesion. At the lower end thereof, a needle 5 for discharging the resin 4 onto the semiconductor substrate of the lead frame 2 is attached. The discharge of this resin is carried out by the supply of high pressure air from a pressure unit 7 connected to the resin vessel 3 via a flow path 6. The pressure unit 7 is composed of a discharge time control unit 8 provided with an electromagnetic valve (not shown), etc., and a discharge pressure control unit 9. The discharge time control unit 8 is connected to a mount control unit 10 and the discharge pressure control unit 9 is connected to a high pressure air supply source 11. The discharge time control unit 8 controls a supply time of high pressure air for discharging resin, i.e., an operating time of the electromagnetic valve in an actual sense. The discharge pressure control unit 9 controls a supply pressure of a high pressure air. Accordingly, there is employed an arrangement such that when the high pressure air supplied from the high pressure air supply source 11 passes through these discharge time control unit 8 and discharge pressure control unit 9, the quantity and the pressure of the high pressure air are controlled, whereby the discharge quantity of the resin 4 discharged by the supply of the high pressure air is indirectly controlled.

In such a die-bonding apparatus, the resin within the resin vessel 3 is gradually reduced during the operation of the apparatus and the air capacity within the resin vessel 3 is increased. Thus, the high pressure air supplied into the vessel 3 changes, so that the resin discharge quantity varies. For correcting such changes in the discharge quantity, a correction circuit 20 is provided. The correction circuit 20 comprises an A/D converter 21, a memory 22, an integration circuit 23, a comparison unit 24, a computation unit 25, and a reference value memory 26 connected between the integration circuit 23 and the comparison unit 24. In the flow path 6 for supplying high pressure air to the resin vessel 3, a pressure sensor 27 for detecting the pressure of the high pressure air is provided. This pressure sensor 27 is connected to the A/D converter 21 of the correction circuit 20. In addition, the computation unit 25 of the correction circuit 20 is connected to the discharge time control unit 8 of the pressure unit 7.

Figure 5:
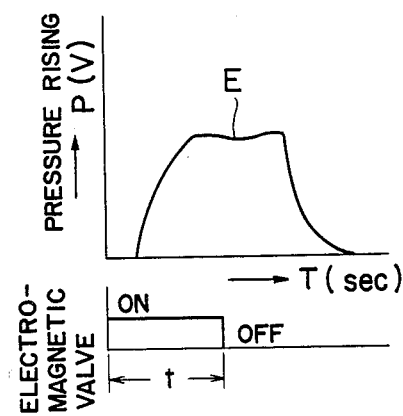
FIGS. 5(a) to 5(d) show characteristic curves of changes in pressure.
Figure 5:
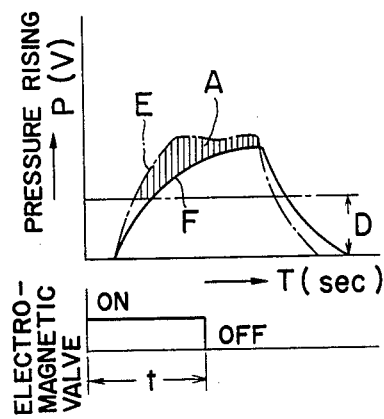
Figure 5:
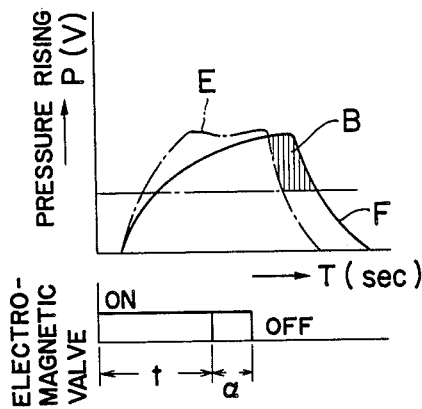
Figure 5:
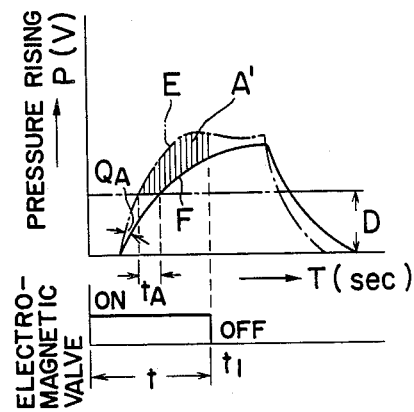

The A/D converter 21 carries out A/D conversion with respect to the output waveform from the pressure sensor 27. The memory 22 memorizes the pressure waveform detected which has been subjected to A/D conversion. The integration circuit 23, integrates the pressure waveform detected from the memory 22. In this integration, effective components above a threshold value D are integrated as shown in FIG. 5. The reference value memory 26 memorizes the integrated value of the reference pressure waveform arbitrarily set in advance. This reference value is also an integrated value of effective components above the threshold value D. The comparison unit 24 makes a comparison between the reference value memorized or stored in the reference value memory 26 and a detected value obtained at the integration circuit 23. The computation unit 25 calculates the difference A between the reference value and the detected value (portions indicated by slanting lines in FIG. 5(b)). Thus, the computation unit 25 produces a signal to the discharge time control unit 8 so as to compensate this difference A, whereby the operating time of the electromagnetic valve of the discharge time control unit 8 is controlled.

The principle of the control to discharge resin from the interior of the resin vessel 3 will be described with reference to FIG. 5. First, a reference value is stored into the reference value memory 26. For the reference value, a resin quantity suitable for adhesively joining or connecting a semiconductor chip onto a portion subject to bonding in a most preferred manner is selected. It is preferable that the discharge condition for discharging such a resin quantity is determined, e.g., by discharging the resin from the resin vessel 3 filled with resin at the beginning of operation of the apparatus. The pressure waveform under such a discharge condition is obtained as a pressure waveform E of high pressure gas as shown in FIG. 5(a). The effective components above the threshold value D of the pressure waveform E are integrated by the integration circuit 23. The integrated value is stored into the reference value memory 26. In this case, the pressure waveform varies dependent upon the operating time t of the electromagnetic valve of the discharge time control unit 8. By the activation of the pressure unit 7, discharge of the resin 4 is conducted. Thus, when the quantity of the resin within the resin vessel 3 decreases, the pressure of the high pressure gas varies as indicated by the curve F in FIG. 5(b). This pressure is detected by the pressure sensor 27. The pressure detected is subject to A/D conversion by the A/D converter and is then memorized into the memory 22. The effective components above the threshold value D are integrated at the integration circuit 23. This integrated value and the integrated value from the reference value memory 26 are compared with each other. Then, the difference between the detected value thus obtained and the reference value is computed at the computation unit 25. This difference A is a difference A between the integrated values of the curves E and F above the threshold value D, which corresponds to the hatched portion A in FIG. 5(b). Since this difference A corresponds to the difference between pressures for discharging the resin, the quantity of the resin discharged is expected to decrease by the difference A. Accordingly, the computation unit 25 sends to the discharge time control unit 8 a command for prolonging the operating time of the electromagnetic valve by α in order to compensate the difference A.

When the discharge time control unit 8 has sent the command to prolong the additional time by α in a manner stated above, the electromagnetic valve is operated during a time period (t+α) in the discharge time control unit 8. Thus, since high pressure air corresponding to the area compensation quantity B (FIG. 5(c)) approximating to the difference A is increased, the discharge quantity of the resin substantially becomes identical to that in the case of the reference pressure waveform, thus maintaining a uniform discharge quantity.

As having been explained above, the principle of the control of this embodiment is to compute the integrated value difference A in FIG. 5(b) to prolong the discharge time t by α as shwon in FIG. 5(c) so that the area of compensation quantity B is substantially equal to that of the difference A. However, as apparent from FIG. 5(b), the pressure waveform has a time lag or delay for the activation of the electromagnetic valve. It is required to judge or decide whether or not the discharge time t should be prolonged within the discharge time t of the electromagnetic valve. However, it is difficult to compute the difference A at a time $t_1$ after the discharge time t because of such a time delay. For the method for determining this difference A by an analogy, the following methods as shown in FIG. 5(d) are conceivable:

① A difference A' between the curves E and F at time $t_1$ immediately before the operation of the discharge time control unit 8 is stopped is computed to thereby reduce it to α. In this case, the integrated value up to the time $t_1$ is memorized into the reference value memory 26 as a reference value.

② From the difference between the pressure rising times of the curves E and F, α is computed. This is accomplished by obtaining the difference between the time at which the curve E intersects with the threshold value D and the time at which the curve F intersects with the threshold value D. In this case, the time at which the curve E reaches the threshold value D is memorized into the reference value memory 26 as a reference value.

③ From the difference $Q_A$ between the angle when curve E rises from the threshold value D and the angle when the curve F rises from the threshold value, α is computed. In this case, the rinsing angle of the curve E is memorized into the reference value memory 26 as a reference value.

④ While the above-mentioned methods ① to ③ determine the area difference A in a real time manner, thereby may be employed a method to obtain the difference A from the operation which has been performed the last time to determine α by analogy from the difference A. Namely, since it is considered that the quantity of the resin remaining within the vessel 3 the last time and the present remaining resin quantity are nearly equal to each other because the quantity of resin discharge is very little, this method contemplates determination of the additional time α in the present operation from the last time information. In this case, since the curves E and F have been already determined, α is determined from the difference A therebetween by analogy.

As just described, in accordance with this embodiment, the presence waveform detected by compared with the reference waveform to thereby determine a discharge time to be prolonged, thus making it possible to discharge substantially the same quantity of resin at all times.

Since the difference A is determined by an analogy using a predetermined reference value to compute the additional time or the additional pressure in the above-mentioned embodiment, there is the possibility that the computed value varies when the reference value fluctuates for any reason. To prevent this, there may be employed a method to compute actually measured values of the area differences A and B on the basis of the result obtained when air pressure is actually applied to feed the computed result back to the computation unit 25. Such a feed-back may be carried out, e.g., by changing a factor or constant multiplying an output signal which the computation unit 25 supplies to the discharge time control unit 8.

Figure 6:
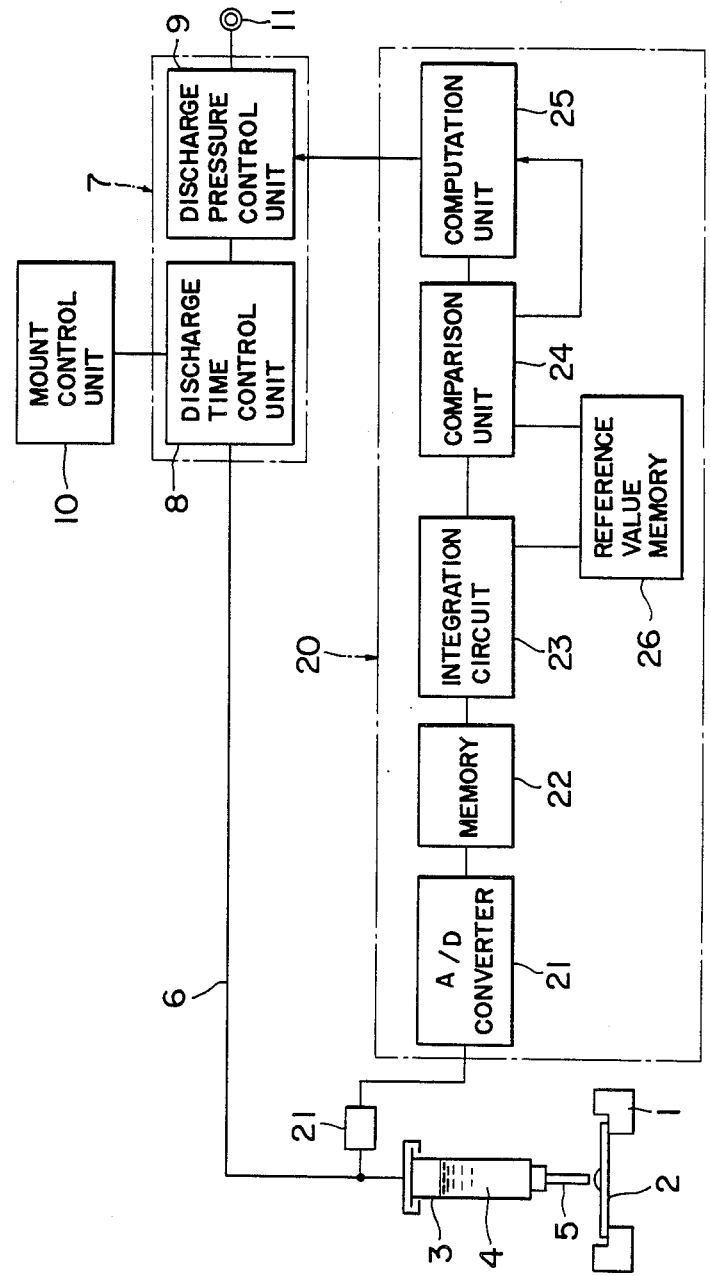
FIG. 6 is a block diagram showing a die-bonding apparatus according to another embodiment of this invention.

FIG. 6 is a block diagram showing a die-bonding apparatus according to another embodiment of this invention wherein the same components as those in the above-mentioned embodiment are caused to correspond to the latter components using the same reference numerals, respectively. In this embodiment, the computation unit 25 of the correction circuit 20 is connected to the discharge pressure control unit 9 of the pressure unit 7. By the same method as that in the above-mentioned embodiment, an additional value of the discharge pressure is computed on the basis of the difference between the reference value and a value detected. The additional value thus computed is output to the discharge pressure control unit 9. Thus, the discharge pressure control unit 9 adjusts, e.g., the aperture diameter of the blow-off nozzle for high pressure air to thereby correct pressure.

It is to be noted that since the pressure sensor 27 detects the pressure of high pressure air in this embodiment, other operations may be carried out by making use of a detected value. For example, where a detected value does not reach a discharge pressure of the resin, warning display may be conducted. Further, such a detected value may be utilized for detecting residual quantity of the resin 4 within the resin vessel 3. Namely, since the detected value does not reach the discharge pressure where the resin vessel 3 becomes empty, this may be utilized for supplement of resin. In addition, the operation of the discharge time control unit 8 and the discharge pressure control unit 9 which are controlled by the correction circuit 20 may be supervised or monitored to confirm the presence or absence of the fault or failure.

As described above, in accordance with this invention, the pressure waveform detected by the pressure sensor is compared with the reference pressure waveform to thereby compensate the difference therebetween, thus making it possible to automatically correct changes in the resin discharge quantity to maintain the discharge quantity constant at all times.

What is claimed is:

1. A die-bonding method for applying high pressure air to a resin vessel under a predetermined discharge condition to thereby discharge resin onto a portion subject to bonding, thus to adhesively join or connect a semiconductor chip to said portion subject to bonding by said resin discharged, said method including:
   a process of detecting a pressure waveform applied to said resin vessel; and
   a process of controlling said discharge condition to compensate a difference between a pressure waveform detected and a predetermined reference pressure waveform so that a predetermined resin quantity is discharged at all times even when the quantity of the resin within said resin vessel varies.

2. A method as set forth in claim 1, wherein said discharge condition is controlled by changing the discharge time of said high pressure air applied to said resin vessel.

3. A method as set forth in claim 1, wherein said discharge condition is controlled by changing the discharge pressure of said high pressure air applied to said resin vessel.

4. A method as set forth in claim 1, wherein said difference is calculated on the basis of a time integrated value of the difference between said output waveform and said reference waveform up to a predetermined time.

5. A method as set forth in claim 1, wherein said difference is calculated on the basis of a difference between the rise time of said output waveform and the rise time of said reference waveform.

6. A method as set forth in claim 1, wherein said difference is calculated on the basis of a difference between the rise angle of said output waveform and the rise angle of said reference waveform.

7. A method as set forth in claim 2, wherein said difference is calculated on the basis of the time integrated value of a difference between said output waveform and said reference waveform up to a predetermined time.

8. A method as set forth in claim 2, wherein said difference is calculated on the basis of a difference between the rise time of said output waveform and the rise time of said reference waveform.

9. A method as set forth in claim 2, wherein said difference is calculated on the basis of a difference between the rise angle of said output waveform and the rise angle of said reference waveform.

10. A method as set forth in claim 3, wherein said difference is calculated on the basis of a time integrated value of the difference between said output waveform and said reference waveform up to a predetermined time.

11. A method as set forth in claim 3, wherein said difference is calculated on the basis of a difference between the rise time of said output waveform and the rise time of said reference waveform.

12. A method as set forth in claim 3, wherein said difference is calculated on the basis of a difference between the rise angle of said output waveform and the rise angle of said reference waveform.

13. A die-bonding apparatus comprising:
a resin vessel containing resin for adhesively joining or connecting a semiconductor chip onto a portion subject to bonding;
a pressure unit for supplying high pressure air into said resin vessel at predetermined discharge time and discharge pressure;
a pressure sensor for detecting a pressure waveform applied to said resin vessel; and
a correction circuit for comparing the pressure waveform detected by said pressure sensor with the predetermined reference pressure waveform to compensate for the difference between said pressure waveform detected and said reference pressure waveform.

14. An apparatus as set forth in claim 13, wherein said correction circuit controls the discharge time of said pressure unit.

15. An apparatus as set forth in claim 13, wherein said correction circuit controls the discharge pressure of said pressure unit.

16. An apparatus as set forth in claim 13, wherein said correction circuit comprises means for calculating said difference on the basis of a time integrated value of a difference between said output waveform and said reference waveform up to a predetermined time.

17. An apparatus as set forth in claim 13, wherein said correction circuit comprises means for calculating said difference on the basis of a difference between the rise time of said output waveform and the rise time of said reference waveform.

18. An apparatus as set forth in claim 13, wherein said correction circuit comprises means for calculating said difference on the basis of a difference between the rise angle of said output waveform and the rise angle of said reference waveform.

19. An apparatus as set forth in claim 14, wherein said correction circuit comprises means for calculating said difference on the basis of a time integrated value of a difference between said output waveform and said reference waveform up to a predetermined time.

20. An apparatus as set forth in claim 14, wherein said correction circuit comprises means for calculating said difference on the basis of a difference between the rise time of said output waveform and a rise time of said reference waveform.

21. An apparatus as set forth in claim 14, wherein said correction circuit comprises means for conjecturing said difference on the basis of a difference between a rise angle of said output waveform and a rise angle of said reference waveform.

22. An apparatus as set forth in claim 15, wherein said correction circuit comprises means for calculating said difference on the basis of a time integrated value of a difference between said output waveform and said reference waveform up to a predetermined time.

23. An apparatus as set forth in claim 15, wherein said correction circuit comprises means for calculating said difference on the basis of a difference between the rise time of said output waveform and the rise time of said reference waveform.

24. An apparatus as set forth in claim 15, wherein said correction circuit comprises means for calculating said difference on the basis of a difference between the rise angle of said output waveform and a rise angle of said reference waveform.

* * * * *